United States Patent [19]
Itoh et al.

[11] Patent Number: 5,936,710
[45] Date of Patent: Aug. 10, 1999

[54] SCANNING TYPE EXPOSURE APPARATUS, POSITION CONTROL APPARATUS, AND METHOD THEREFOR

[75] Inventors: Hiroshi Itoh, Fuchu; Masahiro Morisada, Utsunomiya, both of Japan

[73] Assignee: Canon Kabushiki Kaisha, Tokyo, Japan

[21] Appl. No.: 08/772,767

[22] Filed: Dec. 24, 1996

[30]     Foreign Application Priority Data

Jan. 5, 1996  [JP]  Japan ..................................... 8-017092
 Jan. 19, 1996 [JP]  Japan ..................................... 8-024905

[51] Int. Cl.⁶ ............................. G03B 27/42; G03B 27/32
[52] U.S. Cl. ................................................. 355/53; 355/77
[58] Field of Search ................................. 355/18, 53, 55, 355/67, 77

[56]                 References Cited
                U.S. PATENT DOCUMENTS

| 5,105,075 | 4/1992  | Ohta et al. ............................ 250/201.2 |
| 5,477,304 | 12/1995 | Nishi ........................................ 355/53 |
| 5,699,145 | 12/1997 | Makinouchi ............................. 255/53 |
| 5,699,146 | 12/1997 | Kaminaga ................................. 355/53 |
| 5,734,412 | 3/1998  | Hasebe et al. .......................... 347/247 |

*Primary Examiner*—Safet Metjahic
*Assistant Examiner*—Hung Henry Nguyen
*Attorney, Agent, or Firm*—Fitzpatrick, Cella, Harper & Scinto

[57]                         ABSTRACT

In a scanning type exposure apparatus, throughput is increased by omitting an unnecessary scanning period for settling. The scanning type exposure apparatus includes an exposure unit for exposing a substrate by projecting a pattern by a strip of light, an exposure control unit which turns on and off the exposure operation by the exposure unit, a designation value generator for designating a chip to be scanned and exposed next and a scanning speed, a reference position generator for generating a reference position of the pattern and a reference position of the substrate in accordance with the designation, and a position controller for controlling the positions of the pattern and the substrate on the basis of the reference positions. The reference position generator obtains a settling time for each chip by referring to a table storing predetermined settling times between the pattern and the substrate corresponding to each chip on the substrate and scanning speeds, and generates the reference positions of the pattern and the substrate for each chip on the basis of the settling time when performing exposure operation.

12 Claims, 13 Drawing Sheets

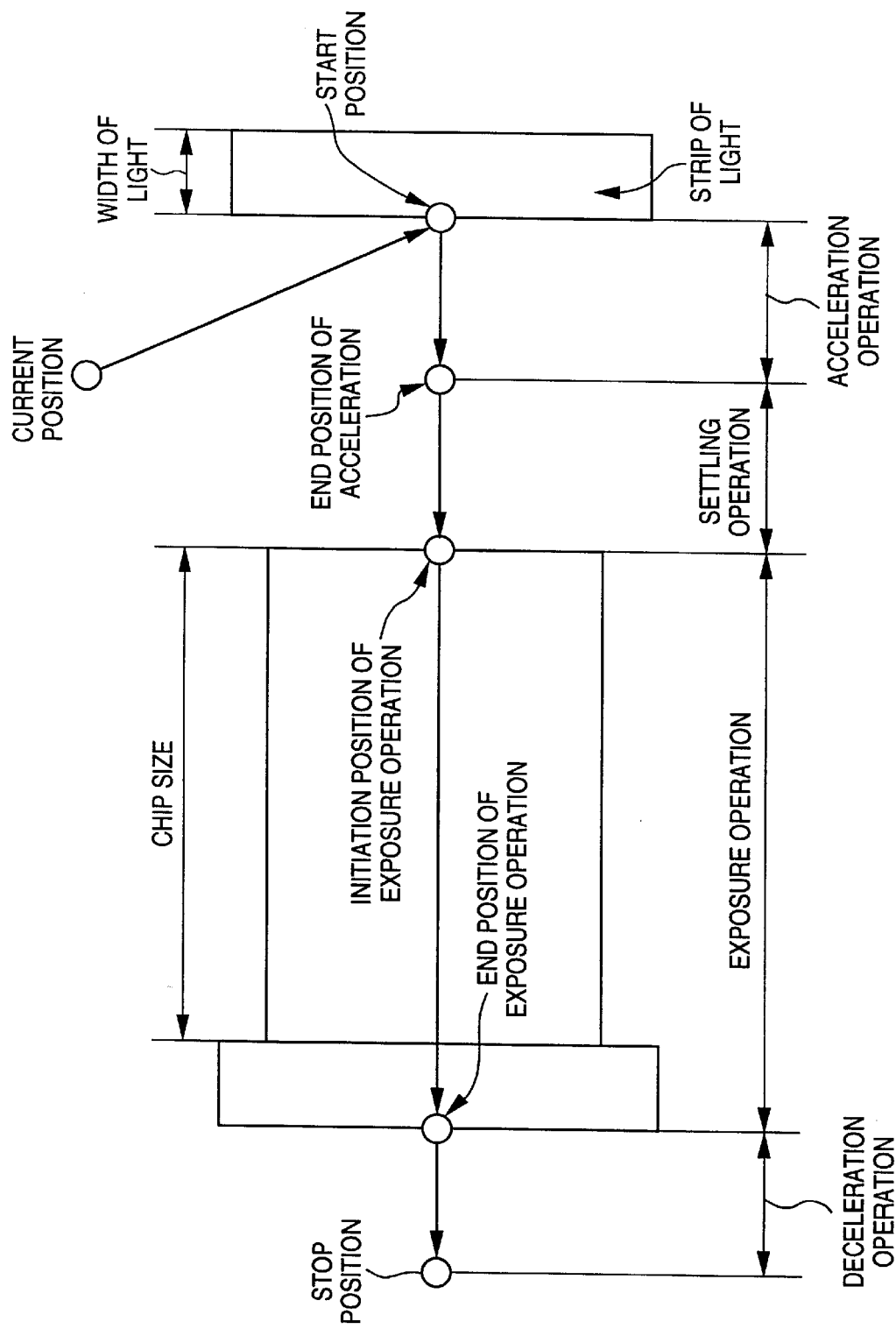

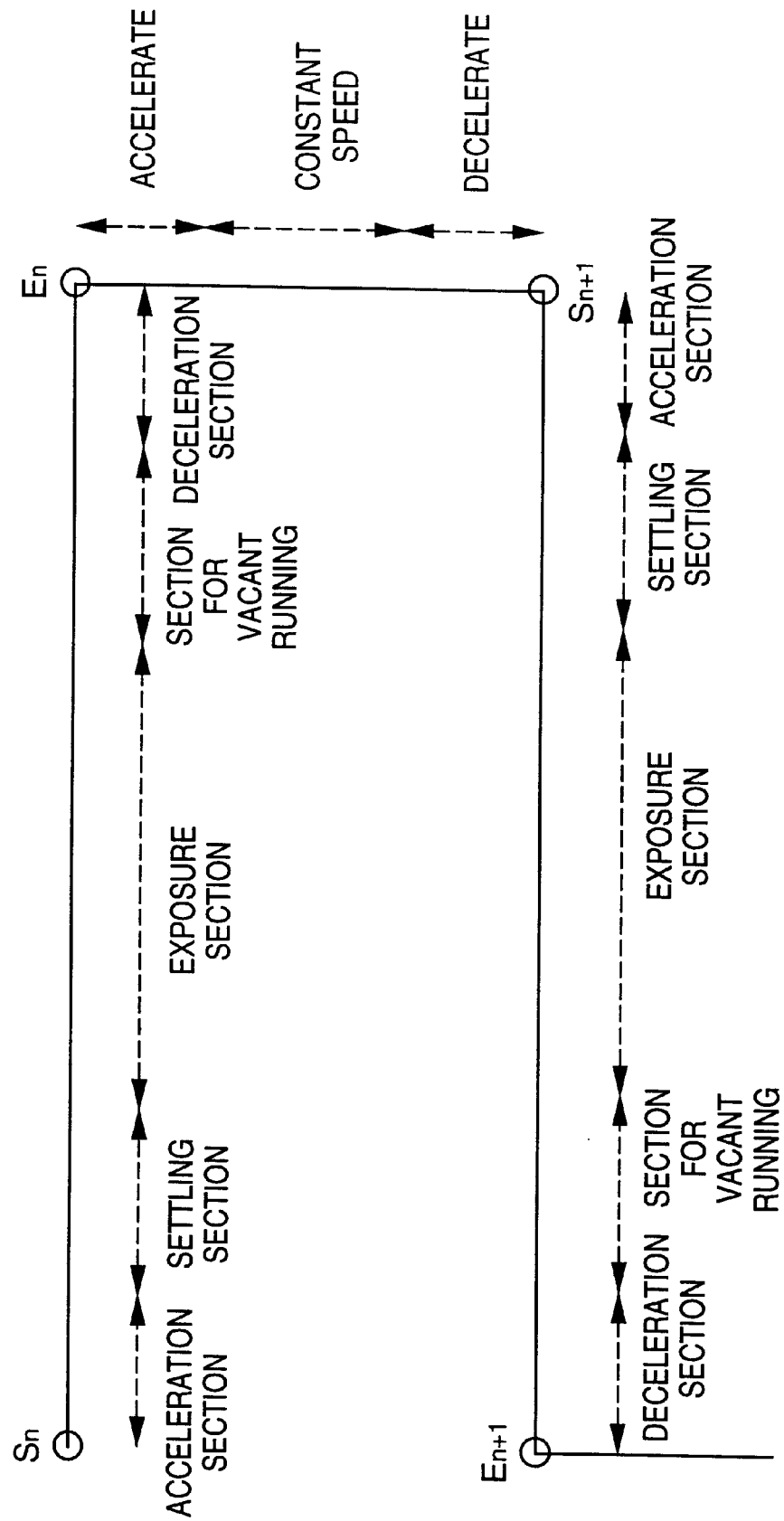

SCANNING TYPE EXPOSURE APPARATUS, POSITION CONTROL APPARATUS, AND METHOD THEREFOR

BACKGROUND OF THE INVENTION

The present invention relates to a scanning type exposure apparatus, a position control apparatus, and a method therefor and, more particularly, to a scanning type exposure apparatus which scans to expose a wafer by projecting a pattern of reticle with a strip of illuminating light, a position control apparatus which controls the position of a stage, and a method therefor.

An XY stage is commonly used for determining a precise position in a two-dimensional plane. In a semi-conductor exposure apparatus, an XY stage is used as a wafer stage in order to move a position on the wafer to a reference position. In a scanning type semi-conductor exposure apparatus which scans at a constant speed, it is necessary to control a reticle stage and a wafer stage to be synchronized at high precision when scanning sections to be exposed (referred as "exposure sections", hereinafter). Further, since it is also necessary to keep the luminous exposure constant, it is important to move both stages at a constant speed.

In order to keep the scanning speed constant during scanning of the exposure section, the XY stage is accelerated so that a predetermined conditions for settling (referred as "settling conditions", hereinafter) are satisfied before reaching the exposure section, and the settling conditions have to be kept satisfied during scanning of the exposure section. The settling conditions are determined on the basis of a variation in luminous exposure and other situations. As an example of the settling conditions, in a case where the XY stage moves while its speed is controlled, the deviations between reference speeds and actual speeds of the XY stage has to be within the tolerance for a predetermined period of time.

However, the characteristics of controlling the XY stage depend upon X and Y coordinate values, thus the settling time required for settling by accelerating the XY stage varies from one position on the wafer to an other since transient response also changes in accordance with the X and Y coordinate values. If a reference locus of the XY stage is determined on the basis of the maximum settling time, i.e., since the XY stage is accelerated until it is settled, it takes too much time to scan the entire wafer, which has bad effects in terms of throughput. There is an often used method in which a gain table having coordinate values in the X and Y coordinate system as indexes is used and the gain which is set in a control structure for controlling the XY stage is changed in accordance with the position of the XY stage (indexes). Further, a method adapting an adaptive control is also often used for compensating variations in characteristics of controlling of the XY stage.

However, it is impossible to completely compensate a variation in characteristic for controlling the XY stage only by using the gain table, and variations in settling time, which is the period of time required by the XY stage to satisfy the settling conditions, for different chip of a wafer can not always be compensated. Thus, the aforesaid problem can be partially solved by using the adaptive control and a control system becomes complicated.

FIG. 2 is a block diagram illustrating a configuration of a scanning type exposure apparatus. The function of each block will briefly explained below. Note, the scanning direction is defined as X direction.

A designation value generator 1 determines the X coordinate position 12 and Y coordinate position 10 of the next chip to be exposed on a wafer 8 on the basis of the present position of the wafer 8. Further, the designation value generator 1 also outputs a scanning speed 11. A wafer reference position generator 3 and a reticle reference position generator 2 determine a reference position locus (a locus indicating relationship between time and reference positions) in the scanning direction on the basis of the scanning speed 11 and the X coordinate position 12 of a chip which are inputted from the designation value generator 1. Then, the wafer reference position generator 3 outputs a wafer reference position data 30 to a wafer position controller 5 and the reticle reference position generator 2 outputs a reticle reference position data 20 to a reticle position controller 4. As a result, the wafer 8 and a reticle 7 are controlled to be at reference positions. When the wafer 8 and the reticle 7 arrive at predetermined positions, an exposure light on/off signal 13 is outputted from the designation value generator 1 to a projecting unit 6, and an exposure operation begins. The projecting unit 6 emits a strip of illumination light toward the reticle 7.

FIG. 3A shows an exposing order of chips on the wafer 8. Further, FIG. 3B is a drawing showing a detailed scan cycle in one of the chips shown in FIG. 3A. FIGS. 4A to 4C show responses in position and speed of the chip, and in synchronous error between the chip and a reticle with respect to time when scanning the chip.

A general processing sequence for scanning exposure for one chip is as follow. Note, before starting the processing, the position of the reticle is moved to a predetermined position with respect to the position of the wafer.

(Step 1) The designation value generator 1 reads a settling time from a parameter table which stores characteristics of a position control system. It is assumed that a scanning speed is given.

(Step 2) Next, the chip to be exposed, X and Y coordinates of the start position of scanning the chip on the wafer (simply called "start position", hereinafter), and total amount of displacement to the position where the exposure starts in the scanning direction are determined on the basis of the read settling time and parameters, such as the scanning speed or the current position of the wafer, the maximum acceleration, and so on.

(Step 3) The wafer moves from the current position toward the start position in step movement.

(Step 4) The wafer is accelerated.

(Step 5) Settling operation is performed for a predetermined settling time.

(Step 6) Exposure operation by a strip of illumination light starts after the settling operation.

(Step 7) The exposure operation is performed by displacing the wafer by an amount which depends upon a predetermined chip size and the width of the strip of light.

(Step 8) The exposure operation is completed.

(Step 9) The wafer is decelerated to stop.

(Step 10) The process returns to step 1 when necessary, and the next chip is exposed.

In the aforesaid conventional method, the processing is performed on the assumption that the settling time is constant for scanning each chip (one scanning operation). However, since the position of the XY stage with respect to the apparatus differs in respective scanning operations, characteristics of the position control system changes for each scanning operation. Therefore, a settling time, required in practice, differs in each scanning operation. In other words, although the predetermined settling time is constant, the settling time required in practice changes for each scanning operation. Accordingly, there is a case where an exposure operation may be started before the synchronous errors satisfy the tolerance conditions for exposure. In contrary, there is a case where settling operation is performed for more than a necessary period of time in spite of the fact that the exposure conditions are already satisfied, since the time for initiating exposure (exposure initiation time) has not come yet.

In order to overcome the former problem, it is possible to select and set the longest settling time which is required in practice as a fixed settling time. However, if the settling time is set to a fixed value, the settling operation will continue for an unnecessary period of time and throughput will be decreased.

Further, it is possible to determine a settling time for each scanning operation by actually exposing and evaluating the exposure result in order to determine proper time for initiating exposure. However, such an operation requires many complicated processes, which decreases processing efficiency.

SUMMARY OF THE INVENTION

The present invention has been made in consideration of the aforesaid situation, and has as its object to increase throughput by setting the proper settling time for each scanning operation for each chip.

It is another object of the present invention to increase efficiency of controlling an XY stage by setting a proper settling time for each section performed with a scanning operation (scanning section).

According to the present invention, the foregoing object is attained by providing a scanning type exposure apparatus which scans and exposes a wafer by projecting a pattern of a reticle on the wafer by a strip of light, the apparatus comprising: driving means for synchronously moving the reticle and the wafer; exposure means for exposing the wafer after the reticle and the wafer are accelerated to a reference scanning speed by the driving means and a settling time for satisfying an exposure condition has passed; and start position determination means for determining a start position at which the reticle starts accelerating and a start position at which the wafer starts accelerating so that a proper settling time is reserved for scanning and exposing each chip and notifying the start positions to the driving means.

According to the present invention, the start position determination means of the above scanning type exposure apparatus preferably has memory means, and the memory means preferably stores settling times determined on the basis of measured synchronous errors between the reticle and the wafer for each chip.

Further, according to the present invention, each of the settling times stored in the memory means of the scanning type exposure apparatus is preferably determined on the basis of the period of time required so that the synchronous errors between the reticle and the wafer converge within a predetermined range.

Furthermore, according to the present invention, each of the settling times stored in the memory means of the scanning type exposure apparatus is preferably determined on the basis of an average and a standard deviation of the synchronous errors between the reticle and the wafer in a predetermined period of time.

Further, according to the present invention, the predetermined period of time is preferably obtained by dividing the width of the strip of light by the reference scanning speed.

Further, according to the present invention, each of the settling times stored in the memory means of the scanning type exposure apparatus is preferably determined on the basis of the synchronous errors between the reticle and the wafer in a predetermined period of time and distribution of intensity of the strip of light.

Furthermore, according to a preferred embodiment of the present invention, synchronous errors for each scanning operation are measured for the entire substrate before initiating an exposure operation, the relationship between position of an XY stage in the X and Y direction, scanning speed, and settling time is stored in a table on the basis of the measured results, and a start position of a chip on the substrate and an initiation time of the exposure operation are determined so as to fit the settling time stored in the table.

Further, in order to determine the settling time, a method in which settling operation is considered completed at the time when absolute values of measured synchronous errors have converged within a predetermined tolerance is considered.

Furthermore, a method for estimating the settling time by calculating averages and standard deviations of synchronous errors is also considered. In this case, the time for calculating the averages and the standard deviations is set to the time to pass the width of a strip of light at scanning speed. Further, to calculate the averages and the standard deviations, values obtained by multiplying the synchronous errors by weights which depend upon exposure intensity are used.

Accordingly, it is possible to estimate characteristics of a scanning operation which is close to the ideal case, and a table of proper settling times can be made.

By using the aforesaid table, exposure is initiated after a proper settling time has passed. As a result, a time is not wasted, thereby increasing throughput.

According to the present invention, the foregoing object is attained by providing a position control apparatus which controls a position of a stage comprising: input means for inputting a reference locus for the stage comprising a group of scanning sections each of which includes an acceleration section, a settling section, and a section for constant speed scanning; correction means for correcting the reference locus on the basis of information on settling times each of which corresponds a scanning section; and driving means for moving the stage in accordance with the reference locus corrected by the correction means.

According to the present invention, the above position control apparatus preferably further comprises storage means for storing the information on the settling times each of which corresponds to each scanning section.

Furthermore, according to the present invention, the correction means of the position control apparatus preferably compares the period of time which is converted from the settling section and the information on settling times each of which corresponds to the scanning section including the settling section, and corrects the start position of the acceleration section on the basis of a comparison result.

Further, according to the present invention, the information on settling times preferably shows periods of time required for deviations between control variables of the stage and a reference input given in accordance with the reference locus to converge within a predetermined range.

Further, according to the present invention, the information on settling times shows periods of time required for averages of deviations between control variables of the stage and reference inputs given in accordance with the reference locus to converge within a predetermined range.

Further, according to the present invention, the position control apparatus preferably further comprises termination means for measuring a settling time in which the stage is settled, comparing the measured result and the information on settling times, and stopping the movement of the stage by the driving means in accordance with a comparison result.

Further, according to the present invention, the position control apparatus preferably further comprises: measurement means for measuring a settling time in which the stage is settled; and updating means for updating the information on settling times stored in the storage means on the basis of a measured result by the measurement means.

Further, according to the present invention, the updating means of the position control apparatus preferably does not update the information on settling times if the difference between the measured result by the measurement means and the information on settling times stored in the storage means is smaller than a predetermined value.

Further, according to the present invention, the position control apparatus preferably further comprises: measurement means for measuring settling time in which the stage is settled; and updating means for updating the information on settling times stored in the storage means on the basis of an average of a plurality of settling times measured by the measurement means.

Furthermore, the foregoing object is also attained by providing a position control method for controlling a position of a stage comprising: an input step of inputting a reference locus for the stage comprising a group of scanning sections each of which includes an acceleration section, a settling section, and a section for constant speed scanning; a correction step of correcting the reference locus on the basis of information on settling times each of which corresponds to each scanning section; and a driving step of moving the stage in accordance with the reference locus corrected at the correction step.

Further, according to a preferred embodiment of the present invention, values indicating a position or a reference speed is generated on the basis of a reference locus including a plurality of scanning sections, each of which has a section for acceleration (referred as "acceleration section", hereinafter), a section for settling (referred as "settling section", hereinafter), and a section for constant speed scanning (referred as "constant speed section", hereinafter), where a settling time in the settling section of each scanning section is fixed. In an XY stage control method and apparatus for driving an XY stage on the basis of the reference input, the reference locus is corrected on the basis of the settling time for each scanning section stored in a table.

The reference locus is corrected in the following manner. In a case where the settling time, stored in a table, for a given scanning section is longer than a predetermined settling time, the reference final position of the previous scanning section is receded from the start position of the given scanning section by the distance which the XY stage moves in a period of time corresponding to the difference between the settling time stored in the table and the predetermined settling time. In a case where the settling time, stored in a table, for a given scanning section is shorter than the predetermined settling time, the reference final position of the previous scanning section is moved toward the start position of the given scanning section by the distance which the XY stage moves in a period of time corresponding to the difference between the settling time stored in the table and the predetermined settling time.

In another example, locus can also be corrected as follows. In a case where the settling time, stored in a table, for a given scanning section is longer than a predetermined settling time, the start position of the scanning section is receded from the final position of the scanning section by the distance which the XY stage moves in a period of time corresponding to the difference between the settling time stored in the table and the predetermined settling time. In a case where the settling time, stored in a table, for a given scanning section is shorter than the predetermined settling time, the reference start position of the scanning section is moved toward the final position of the scanning section by the distance which the XY stage moves in a period of time corresponding to the difference between the settling time stored in the table and the predetermined settling time.

Here, the settling time is the period of time required to satisfy the condition that the difference between a position or speed of the XY stage and a reference position or speed is smaller than a predetermined value for a predetermined period of time, for example. In another example, the settling time is a period of time required to satisfy the condition that a moving average of differences between a position or speed of the XY stage and a reference position or speed is smaller than a predetermined value for a predetermined period of time.

Further, the settling time used when the XY stage moved on the basis of the corrected reference locus is measured and compared to a corresponding settling time stored in the table, and the XY stage can be stopped immediately in accordance with the comparison result.

In addition, it is preferred to measure the settling time for each scanning section when performing a scanning operation, and to correct the settling time for each scanning section stored in the table by substituting it with the measured value.

The aforesaid correction can be performed by measuring the settling time for each scanning section when performing scanning operation and substituting the value obtained by adding a predetermined value to the measured value, for example. Further, in a case where the measured value is outside of a predetermined range which includes the settling time of corresponding scanning section stored in the table, the correction can be performed by substituting the corresponding settling time stored in the table with the measured value. Furthermore, the correction can be also performed by obtaining averages of settling times of each scanning section measured for the predetermined number of times when performing scanning operation, then correcting a settling time for each scanning section stored in table in accordance with the averages.

The table may have indexes to ranges permissible (referred as "permissible range", hereinafter) as settling times for respective corresponding scanning sections. In this case, the settling time for each scanning section is measured when performing a scanning operation, and in a case where a sum of the measured value and a predetermined value is larger than the upper limit value of the corresponding permissible range or smaller than the lower limit value of the corresponding permissible range, the table can be corrected by substituting an index to the permissible range with an index indicating a different permissible range which includes the sum.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3B shows the scanning cycle;

FIG. 8 shows a reference scanning locus on an XY plane of an XY stage in the apparatus shown in FIG. 6;

DETAILED DESCRIPTION OF THE PREFERRED EMBODIMENTS

First Embodiment

Figure 1:
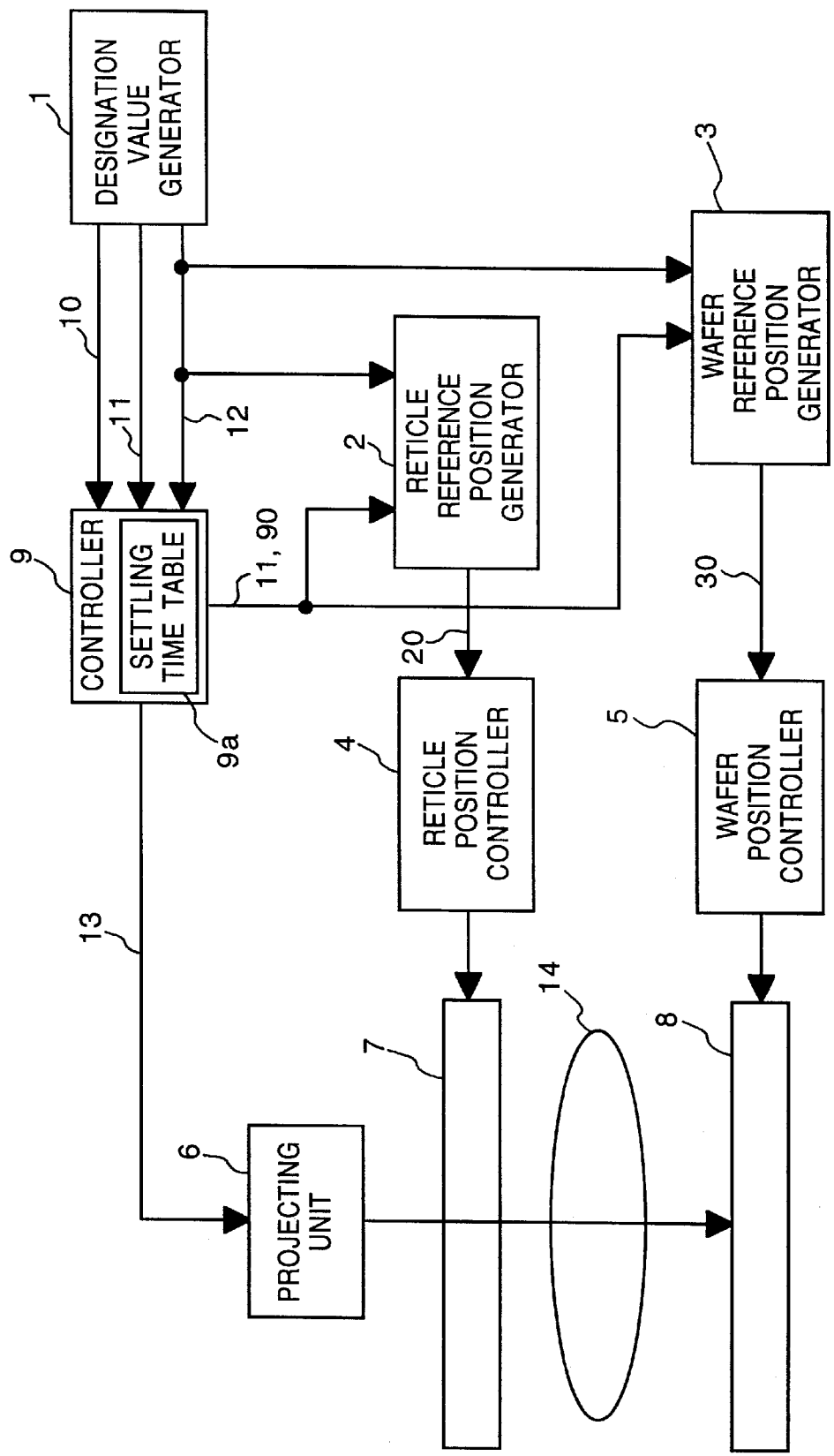
FIG. 1 is a block diagram illustrating a configuration of a scanning type exposure apparatus according to an embodiment of the present invention.
Figure 2:
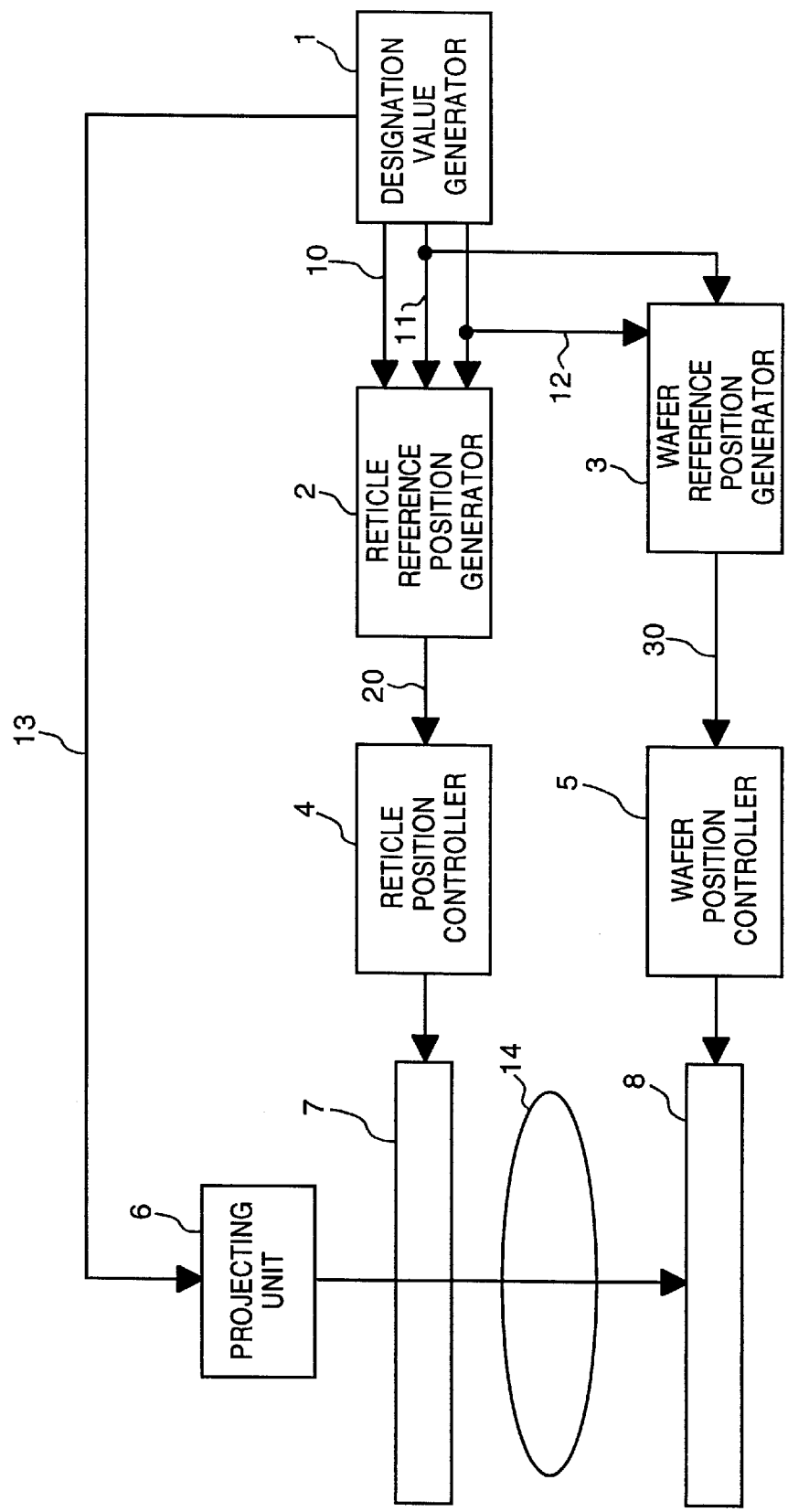
FIG. 2 is a block diagram illustrating a configuration of a conventional scanning type exposure apparatus.
Figure 3A:
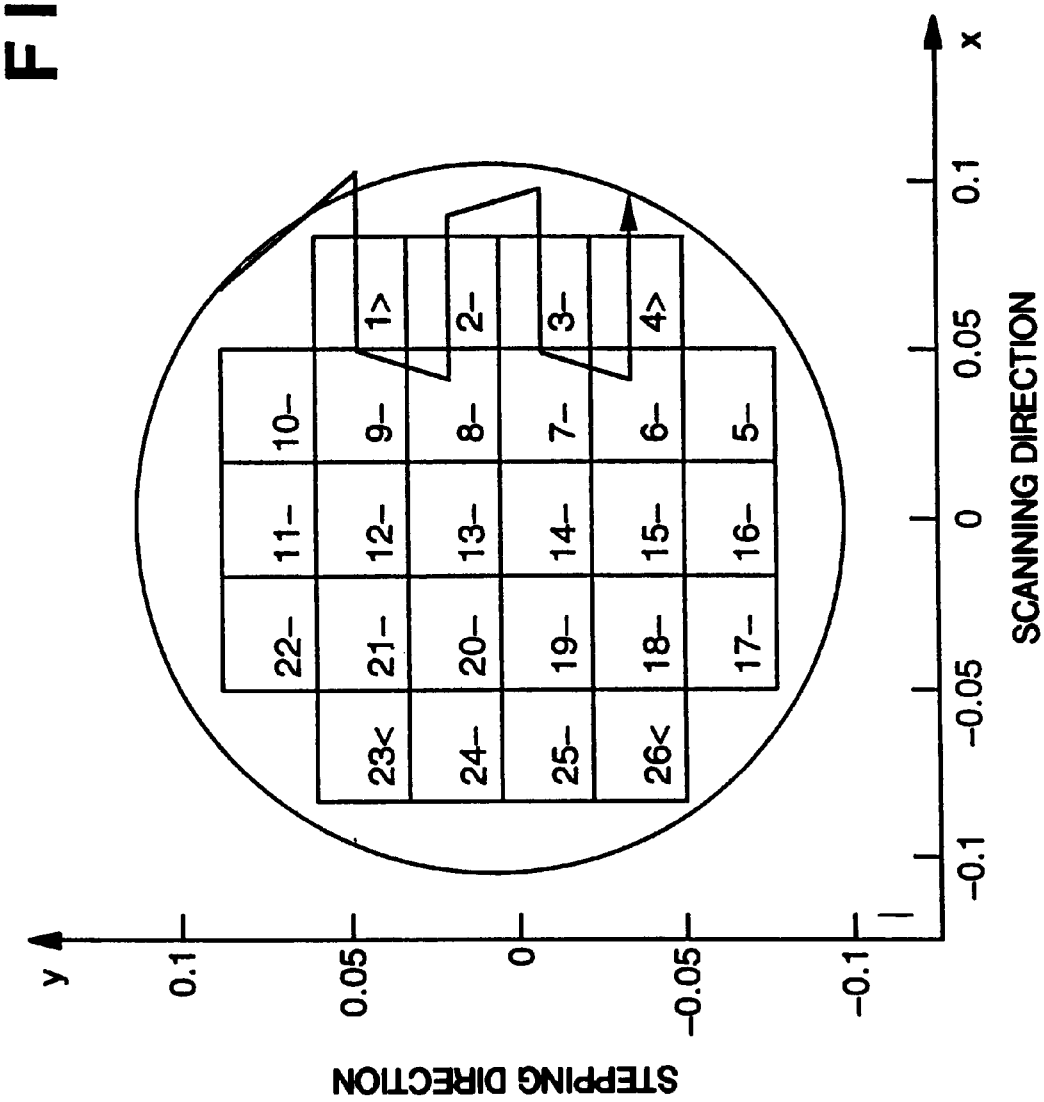
FIG. 3A is a diagram showing a locus on a wafer.

FIG. 1 is a block diagram illustrating a configuration of a scanning type exposure apparatus according to an embodiment of the present invention.

In FIG. 1, the designation value generator 1 determines the X coordinate position 12 and the Y coordinate position 10 of the next chip on the basis of the current position of the wafer 8. It is assumed that the scanning speed 11 is given to the designation value generator 1. A controller 9 determines the settling time on the basis of the scanning speed 11, the Y coordinate position 10 and the X coordinate position 12 of a chip, and the settling time table 9a. Then, an X coordinate position 90 at which a scanning operation is started on the wafer 8 is calculated in accordance with the settling time. The wafer reference position generator 3 and the reticle reference position generator 2 determine reference position patterns on the basis of the scanning speed 11 and the X coordinate position 90 on the wafer 8 inputted from the controller 9. The wafer reference position generator 3 generates and outputs the reference position 30 on the wafer 8 to the wafer position controller 5, and the reticle reference position generator 2 generates and outputs the reference position 20 on the reticle 7 to the reticle position controller 4. As a result, the XY stage which supports the wafer 8 and the XY stage which supports a reticle 7 are synchronously moved so as to be in reference position relationship. When a predetermined period of time has passed or when the XY stages are moved to reference positions, an exposure ON/OFF signal 13 is outputted from the controller 9 to the projecting unit 6, thereby exposure starts. The projecting unit 6 illuminates a strip of light onto the reticle 7 so that the pattern on the reticle 7 is projected on the wafer 8 through an optical system 14.

An operational sequence of exposure is as the same as the conventional operational sequence explained as above except step 1 which changes to as follow.

(Step 1) A settling time is read from a settling time table 9a on the basis of the X and Y coordinate values of a chip and scanning speed in a scanning operation.

In other words, the settling time is conventionally constant for all the scanning operations. In contrast, the settling time is individually determined for each scanning operation in the present invention. The settling time is given as a function of X and Y coordinates of a chip and scanning speed in a scanning operation as shown in the following equation (1).

$$\text{Settling time} = f(X \text{ coordinate of a chip, } Y \text{ coordinate of a chip, Scanning speed}) \quad (1)$$

Settling times to be stored in the settling time table 9a are determined in the following manner.

(Operation 1) Initialize settling times in the table 9a to a predetermined constant.

(Operation 2) Perform scanning operation in the conventional operational sequence.

(Operation 3) Measure synchronous errors between the wafer 8 and the reticle 7 during performing scanning operation.

(Operation 4) Obtain a settling time on the basis of the synchronous errors, and store it in the table 9a in correspondence with the X and Y coordinates of the chip and the scanning speed.

(Operation 5) Perform scanning operation on the entire surface of the wafer 8 by repeating the aforesaid operations 2 to 4 for each exposure section (chip) and complete the table 9a.

Figure 5:
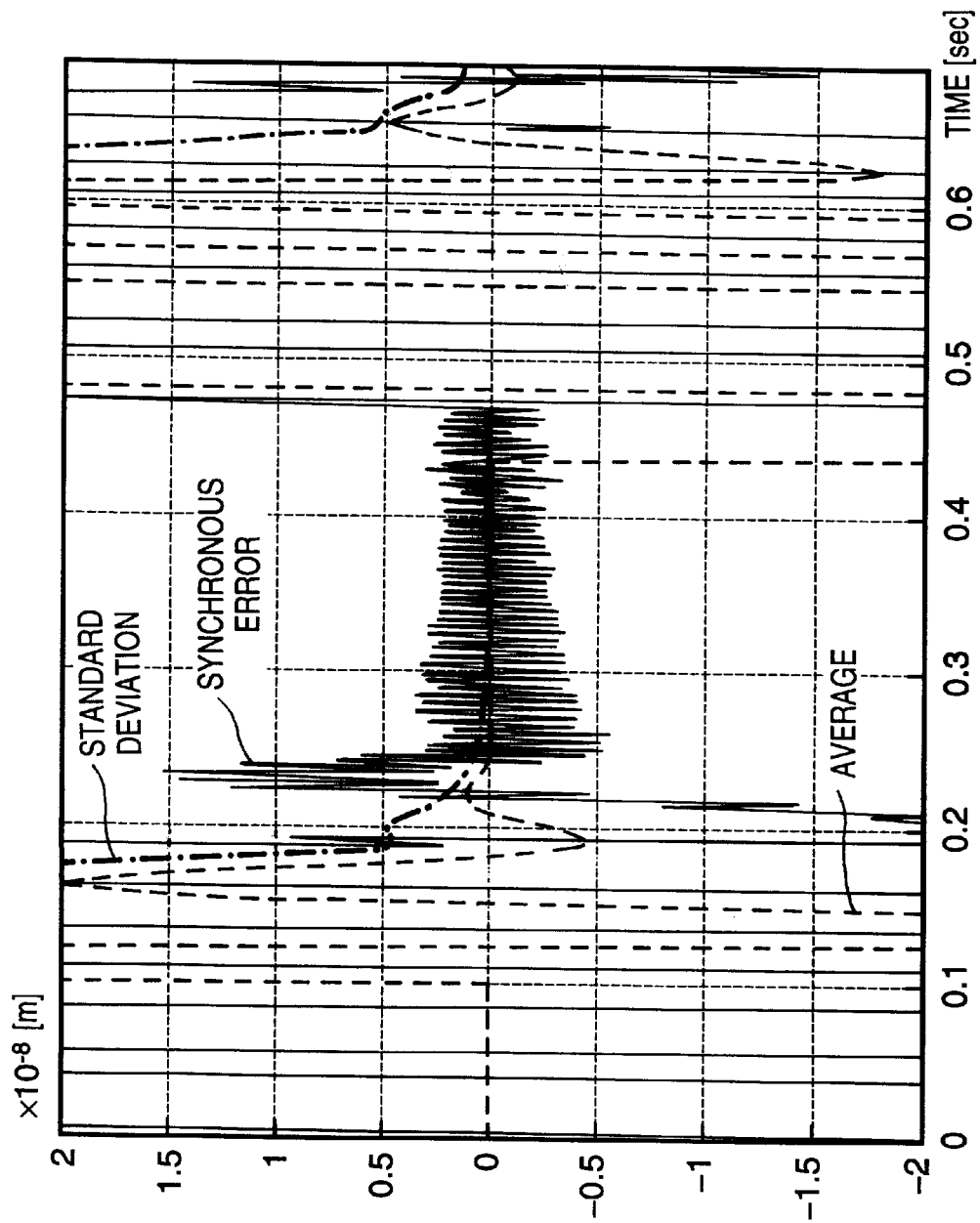
FIG. 5 is a graph showing synchronous errors, averages and standard deviations of synchronous errors with respect to time.

If the measured synchronous errors have a waveform as shown in FIG. 5, the settling time in the operation 4 is obtained in the following method.

EXAMPLE 1

Obtain absolute values of the synchronous errors, and obtain a period of time in which the absolute values converge within a predetermined tolerance, then set this time as the settling time.

EXAMPLE 2

Given that the width of the strip of illumination light is 6 mm, scanning speed is 120 mm/sec, and the intensity of the light is constant across the width, then the synchronous errors during a time required to move across the width at the scanning speed, i.e., 6/120=0.05 sec, affects exposure. Therefore, the averages and the standard deviations of the synchronous errors in this period are calculated. These values respectively correspond to the barycenter displacement and are contrast when performing exposure. Tolerances are set for these two values, and a period of time required for the two values to converge within the tolerances is obtained and set as a settling time. FIG. 5 shows the synchronous errors and their averages and standard deviations.

Note, in the above embodiment, the intensity of light across the width is considered to be constant. However, the intensity of light distribution is not constant in practice, thus it is preferred to calculate weight factors, based on time corresponding to the distribution of the intensity and calculate averages and standard deviations of synchronous errors after multiplying the errors by the weight factors.

Second Embodiment

In the first embodiment, the table 9a which contains settling times in correspondence with variables, X and Y coordinates and a scanning speed of a chip for each scanning operation is disclosed. In a case where a value of variables, such as scanning speed, which is not stored in the table 9a is inputted, it is preferred to use a settling time corresponding to a variable which is closest to the input value. Further, in this case, it is also preferred to calculate the settling time by interpolating between variables stored in the table 9a. For example, a settling time stored in the table is 100 msec when the position of a chip is at X=100 mm, Y=140 mm, and the scanning speed is 120 mm/sec is given. Further, given that the settling time stored in the table is 80 msec when the chip is at the same position but the scanning speed is 160 mm/sec. Under this condition, if an input scanning speed is 140 mm/sec which is not in the table, the settling time $T_s$ in this case can be estimated from a simple equation of linear interpolation as shown in the equation (2).

$$T_s = 100 + ((80 - 100)/(160 - 120)) \times (140 - 120) \quad (2)$$
$$= 90 \text{ msec}$$

Similarly, in a case where the input position of a chip is not in the table 9a, it is possible to obtain the settling time corresponding to the given position of the chip by performing similar interpolation.

According to the second embodiment of the present invention, it is possible to start exposure operation after the proper settling time for each chip in the wafer has passed, since the settling time is determined for each chip on the XY stage by referring to a table containing settling times for each chip in the wafer set on the basis of synchronous errors between a substrate and an original pattern for each chip and scanning speed. Therefore, it is possible to increase throughput by cutting unnecessary scanning time.

Third Embodiment

An XY stage control apparatus according to the third embodiment is suitable for a scanning type exposure apparatus, such as the one explained in the first and second embodiments, which performs exposure by using a strip of illumination light.

Figure 6:
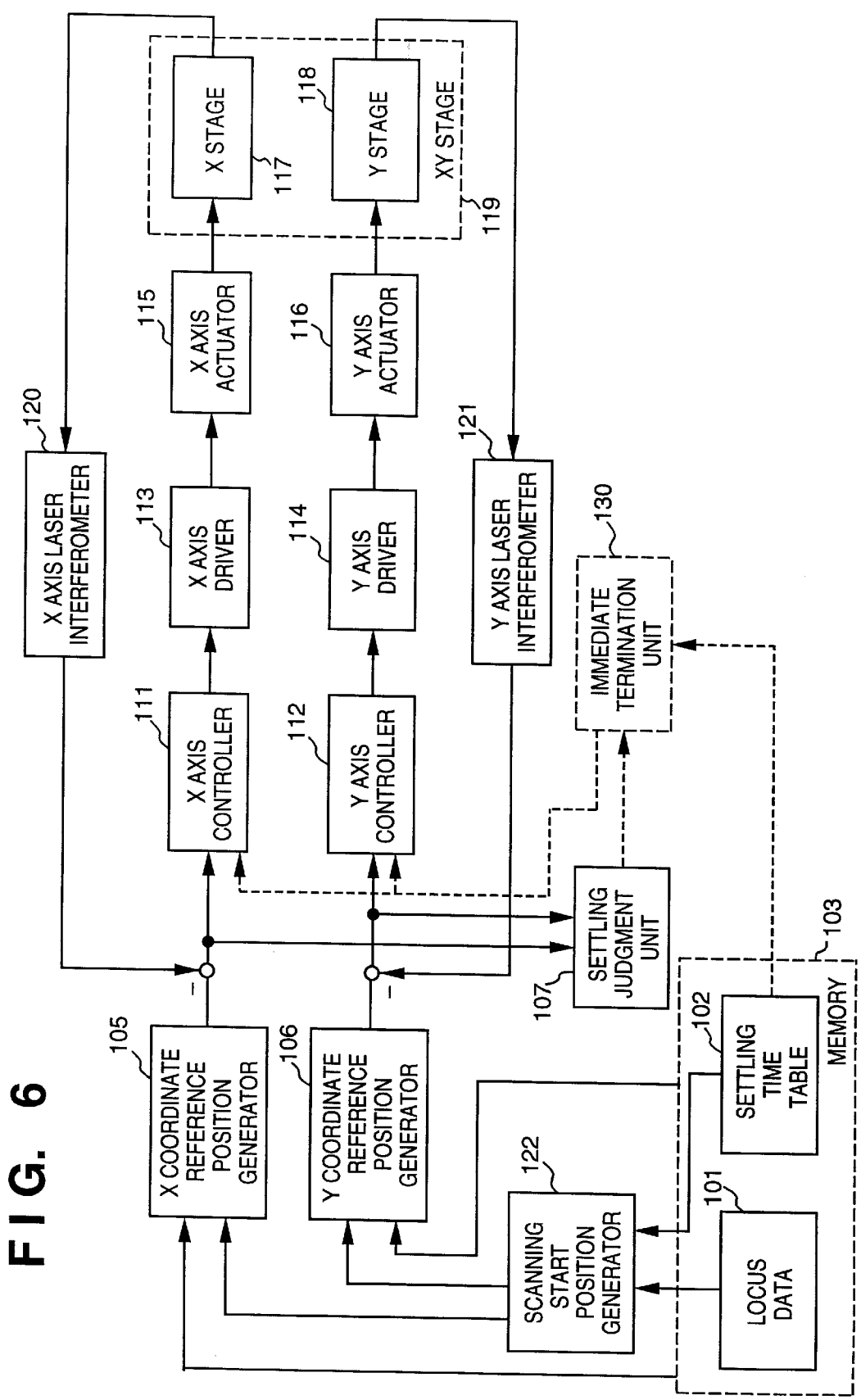
FIG. 6 is a block diagram illustrating a configuration of an XY stage control apparatus in a scanning type semiconductor manufacturing apparatus according to a third embodiment of the present invention.

FIG. 6 is a block diagram illustrating the XY stage control apparatus in a scanning type exposure apparatus according to the third embodiment. In FIG. 6, reference numeral 103 denotes a memory for storing data; 101, data of a reference locus (referred as "locus data", hereinafter) on a two dimensional plane of an XY stage stored in the memory 103; 102, a settling time table (also simply referred as "table 102", hereinafter), stored in the memory 103, in which settling times each of which is measured for each scanning section in advance are arranged in the scanning order; 122, a scanning start position generator for calculating a start position of a scanning section in the XY stage in accordance with the locus data 101 and the table 102; 105, an X coordinate reference position generator for generating a reference position on an X stage at current time; 106, a Y coordinate reference position generator for generating a reference position on a Y stage at current time; 107, a settling judgment unit for judging settling on the basis of deviations of X coordinate positions and deviations of Y coordinate positions; 111, an X axis controller; 112, a Y axis controller; 113, an X axis driver; 114, a Y axis driver; 115, an X axis actuator; 116, a Y axis actuator; 117, an X stage which is to be moved; 118, a Y stage which is to be moved; 119, an XY stage comprising the X stage 117 and the Y stage 118; 120, an X axis laser interferometer for detecting a position of the X stage 117; and 121, a Y axis laser interferometer for detecting a position of the Y stage 118.

Next, an operation of the XY stage control apparatus configured as above is explained.

The position of the X stage 117 is detected by the X axis laser interferometer 120, and a deviation between the detected position and an X coordinate reference position value generated by the X coordinate reference position generator 105 is inputted to the X axis controller 111. The X axis controller 111 performs an operation for control, and outputs the obtained result to the X axis driver 113. The X axis driver 113 drives the X axis actuator 115 by performing digital-analog conversion and amplifying a current, thereby driving the X stage 117 which is mechanically connected to the X axis actuator 115.

Similar operation is performed for the Y axis. The position of the Y stage 118 is detected by the Y axis laser interferometer 121, and a deviation between the detected position and a Y coordinate reference position value generated by the Y coordinate reference position generator 106 is inputted to the Y axis controller 112. The Y axis controller 112 performs an operation for control, and outputs the obtained result to the Y axis driver 114. The Y axis driver 114 drives the Y axis actuator 116 by performing digital-analog conversion and amplifying a current, thereby driving the Y stage 118 which is mechanically connected to the Y axis actuator 116. Accordingly, it is possible to control to displace the XY stage 119 to a reference position.

The X coordinate reference position generator 105 calculates the X axis reference position value at current time on the basis of the reference acceleration, reference speed and reference position included in the locus data 101 stored in the memory 103, and the start position of scanning operation on the X axis calculated by the scanning start position generator 122 in accordance with the equation (3).

$$x_r = x_r^0 + \frac{1}{2}a_r t^2 \qquad 0 \le t \le t_1 \quad (3)$$
$$x_r = x_r^0 + \frac{1}{2}a_r t_1^2 + v_r(t - t_1) \quad t_1 \le t \le T - t_1$$
$$x_r = x_r^T - \frac{1}{2}a_r(T - t)^2 \qquad T - t_1 \le t \le T$$

Where, $t_1=v_r/a_r$, $T=t_1+(x_r^T-x_r^0)/v_r$, $a_r$ is the reference maximum acceleration, $v_r$ is the reference maximum speed, $x_r^0$ is a start position in the X axis, $x_r^T$ is a reference position in the X axis, and t is the time passed since scanning operation is started.

The Y coordinate reference position generator 106 calculates the Y axis reference position value at current time on the basis of the reference acceleration, reference speed and reference position included in the locus data 101 stored in the memory 103, and the start position of scanning operation on the Y axis calculated by the scanning start position generator 122 in accordance with the equation (4).

$$y_r = y_r^0 + \frac{1}{2}a_r t^2 \qquad 0 \le t \le t_1 \quad (4)$$
$$y_r = y_r^0 + \frac{1}{2}a_r t_1^2 + v_r(t - t_1) \quad t_1 \le t \le T - t_1$$

-continued $$y_r = y_r^T - \frac{1}{2}a_r(T-t)^2 \qquad T-t_1 \leq t \leq T$$

Where $y_r^0$ is a start position in the Y axis, and $y_r^T$ is a reference position in the Y axis.

Figure 7A:
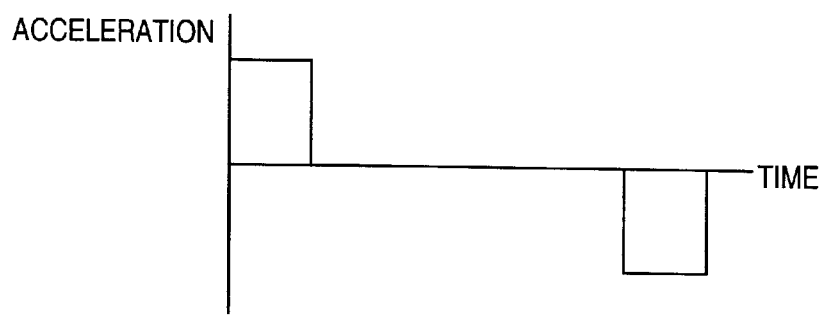
FIGS. 7A to 7C are graphs showing transition patterns of acceleration, speed and position generated by a reference position generator shown in FIG. 6 with respect to time.
Figure 7B:
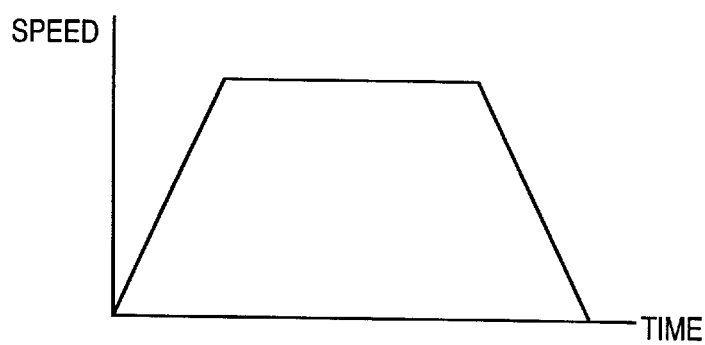
Figure 7C:
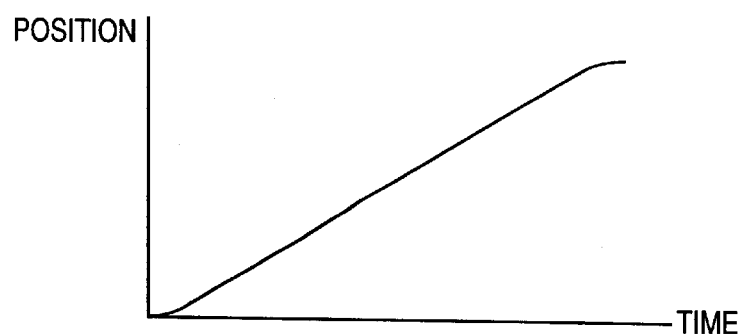

FIG. 7C is a graph showing transition of a reference position, whose coordinate values are generated by the reference position generators 105 and 106, with respect to time when a speed of the XY stage 119 is controlled as shown in FIG. 7B. FIGS. 7A and 7B are graphs showing speed and acceleration of the XY stage 119.

The locus data 101 is stored in the memory 103 in advance assuming that the settling time is a constant value $T_s$ for all the scanning sections. FIG. 8 is a plot of a part of the locus data 101 on a two dimensional plane. In FIG. 8, $S_n$ denotes a start position of scanning operation in an n-th scanning section, $E_n$ is a stop position of the scanning operation in the n-th scanning section. Each scanning section includes an acceleration section, a settling section, an exposure section (or constant speed section), a section for vacant running, and a section for deceleration (referred as "deceleration section", hereinafter). During exposure, the XY stage 119 is controlled so as to maintain a constant speed. The settling time table 102 contains results of settling times $t_n$ (n=1~N, N is the total number of scanning sections) of the XY stage 119 in all the scanning sections measured in advance and is stored in the memory 103.

Each of the settling times $t_n$ is preferably a period of time required for deviations between the controlled variable (in this case, position) of the XY stage 119 and the reference position to converge within a limited range, or a period of time required for a moving average of the deviations to converge within a limited range.

The scanning start position generator 122 corrects the reference locus in accordance with the equation (5). As shown in the equation (5), the correction of the reference locus is performed by correcting the start position of scanning operation $S_n$ on the basis of the settling time $t_n$ in the settling time table 102.

$$S'_n = S_n - \sigma V_s \cdot (t_n - T_s) \qquad (5)$$

Where $S'_n$ is a start position of scanning operation after the correction, $\sigma$ is a predetermined safety factor, and $V_s$ is a scanning speed.

Figure 9:
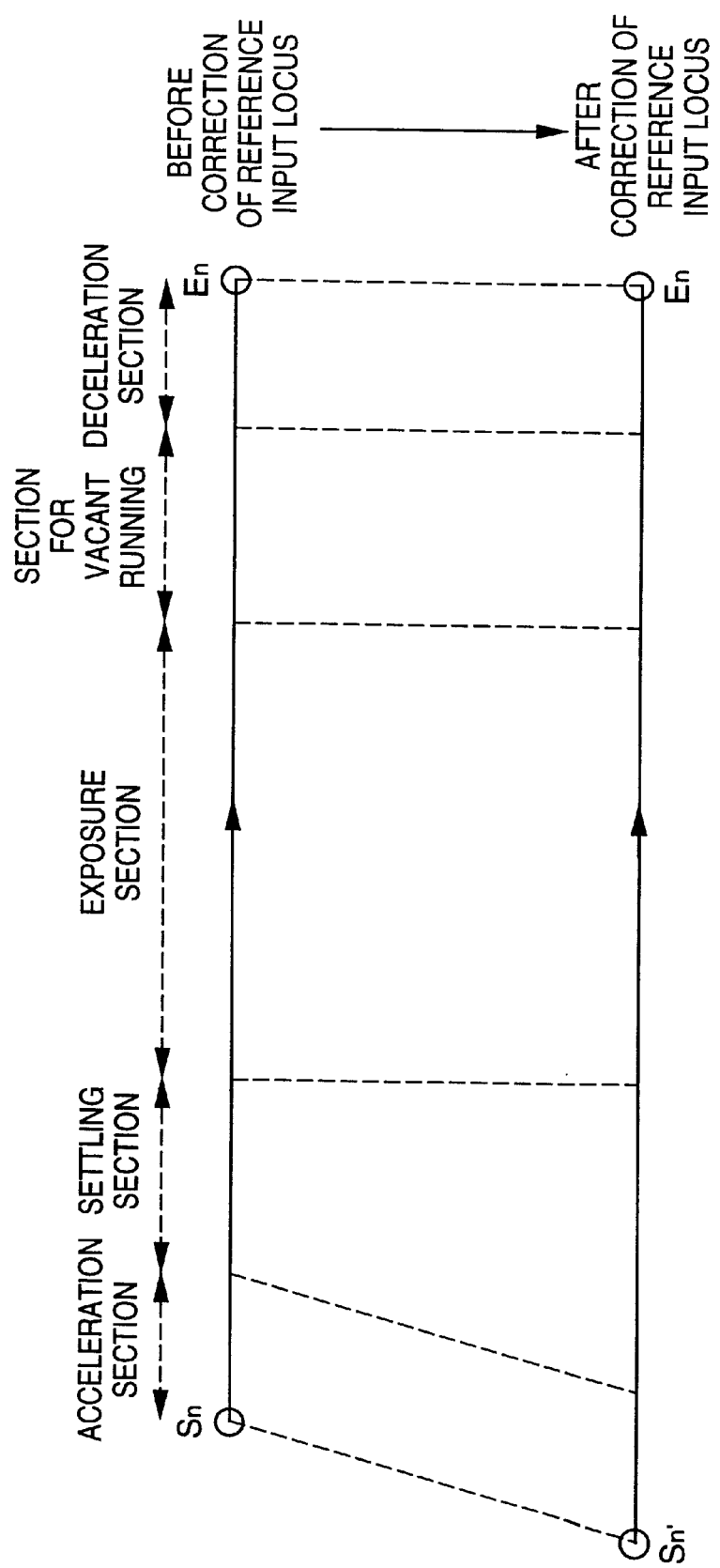
FIG. 9 is an explanatory view showing how to correct a reference locus of the apparatus shown in FIG. 6.

In a case of scanning in the positive direction in a coordinate system defining the start position $S_n$, since $V_s>0$, if $t_n>T_s$, the second term of the right hand side of the equation (5) becomes positive, and the start position of scanning operation $S_n$ is corrected in the negative direction, namely in the receding direction from the stop position of the scanning operation. If $t_n<T_s$, the second term of the right had side of the equation (5) becomes negative, and the start position of scanning operation $S_n$ is corrected in the positive direction, namely in the approaching direction to the stop position of the scanning operation. In a case of scanning in the negative direction, since $V_s<0$, if $t_n>T_s$, the second term of the right had side of the equation (5) becomes negative, and the start position of scanning operation $S_n$ is corrected in the positive direction, namely in the receding direction from the stop position of the scanning operation. Further, if $t_n<T_s$, the second term of the right hand side of the equation (5) becomes positive, and the start position of scanning operation $S_n$ is corrected in the negative direction, namely in the approaching direction to the stop position of scanning operation. FIG. 9 shows an example of correcting the reference locus on a two dimensional lane in a case where, given that the direction to the right is the positive direction, the scanning is performed in the positive direction and $t_n>T_s$.

It should be noted that in order to have the start position of scanning operation $S_n$ match the stop position of scanning operation $E_{n-1}$ of the previous scanning section, the stop position of scanning operation $E_{n-1}$ is corrected.

The scanning start position generator 122, the X coordinate reference position generator 105, the Y coordinate reference position generator 106, the X axis controller 111, the Y axis controller 112 and the settling judgment unit 107 are realized as algorithms executed by a CPU (not shown).

In this apparatus, in a case where the actual settling time $t_n$ stored in the table 102 does not match the predetermined settling time $T_s$, by shifting the start position of acceleration (or of scanning operation) by the difference corresponding to the difference between the above two settling times, exposure operation can be performed in a state where the XY stage 119 is perfectly settled, and it is possible to shorten the period of time required to scan the entire surface of a wafer.

Figure 10:
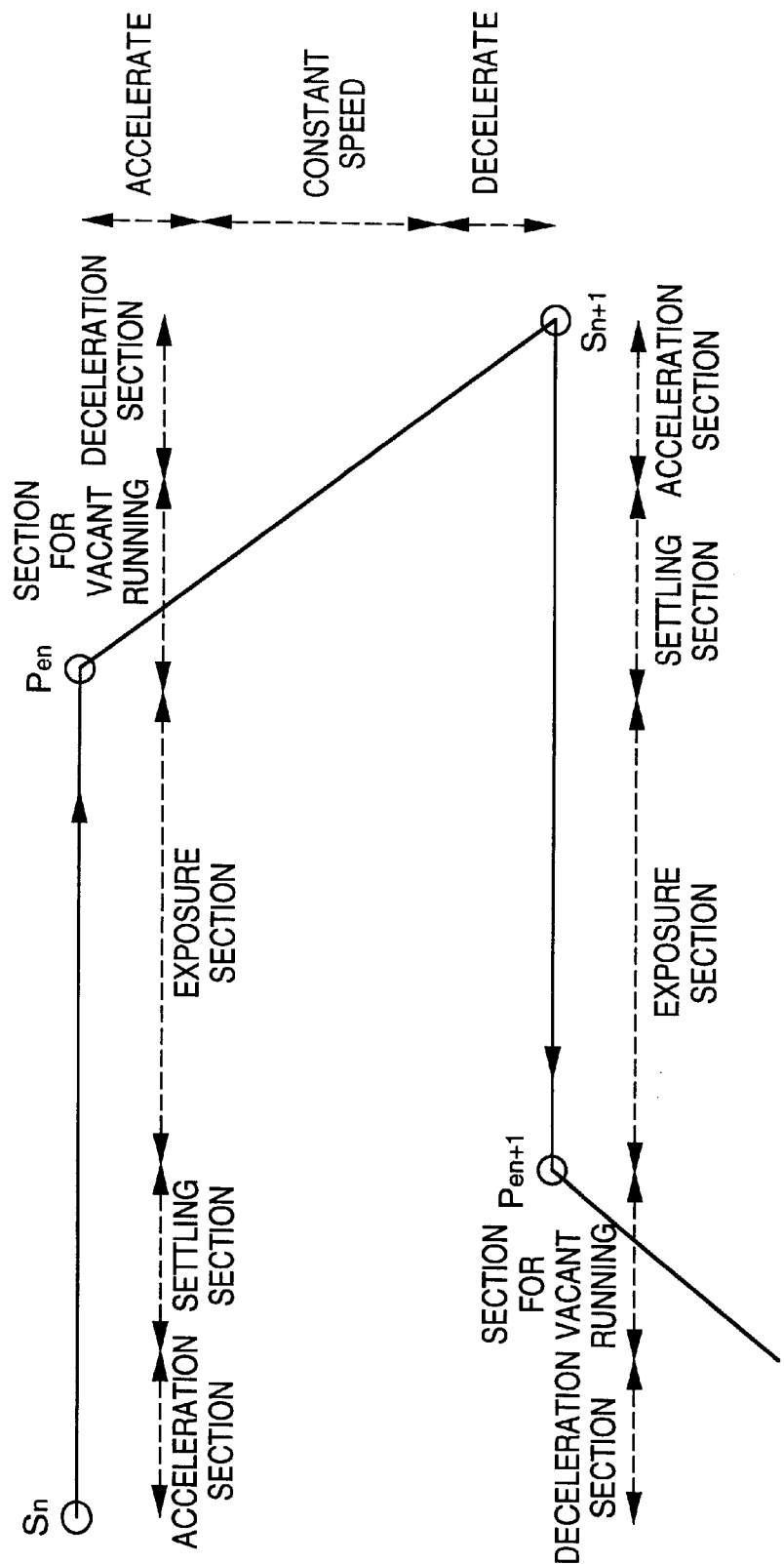
FIG. 10 shows another reference scanning locus on the XY plane of the XY stage in the apparatus shown in FIG. 6.

Note, in the aforesaid description, the reference scanning locus as shown in FIG. 8 is used, however, it is possible to use a reference locus, as shown in FIG. 10, in which the XY stage starts moving in the vertical direction with respect to the scanning direction when the exposure is completed.

Further, in the third embodiment, a position control system is used. However, it is possible to use a speed control system in sections for acceleration, constant speed operation, and deceleration, then switch to a position control system at the end of the deceleration section. In this case, a settling judgment condition in which deviations between the reference speeds and actual speeds of the XY stage 119 are within the tolerance for a predetermined period of time is used.

Further, it is possible to use a control method which determines the occurrence of an error to stop the XY stage 119 immediately when an actual settling time is larger or smaller the settling time stored in the table 102 by a predetermined tolerance or more. This control method can be realized by providing an immediate termination unit 130 (refer to FIG. 6) which compares the settling time $t_n$ stored in the table 102 and an actual settling time obtained in accordance with judgment result by the settling judgment unit 107 and instructs immediate termination of the scanning operation to the X axis controller 111 and Y axis controller 112 when the difference between the above two settling times is outside of a predetermined tolerance.

Fourth Embodiment

Figure 11:
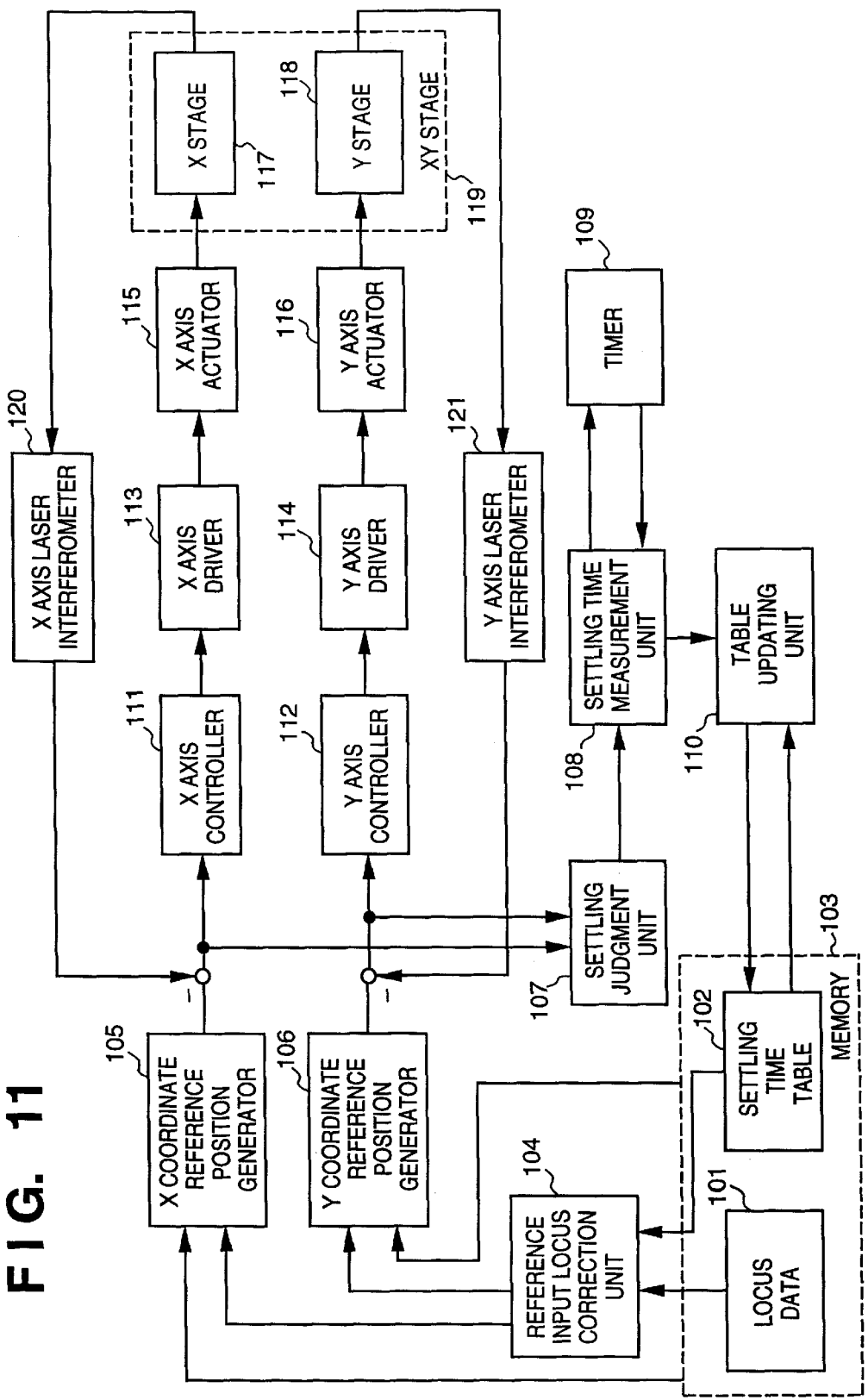
FIG. 11 is a block diagram illustrating a configuration of an XY stage control apparatus in a scanning type semiconductor manufacturing apparatus according to a fourth embodiment of the present invention.

FIG. 11 is a block diagram illustrating a configuration of an XY stage control apparatus in a scanning type exposure apparatus according to a fourth embodiment of the present invention. This apparatus further comprises a settling time measurement unit 108 for measuring an actual settling time on the basis of an output from the settling judgment unit 107, a timer 109 used for obtaining the settling time, and a table updating unit 110 for updating the settling time stored in the table 102 on the basis of the actual settling time measured by the settling time measurement unit 108 in addition to the configuration shown in FIG. 6. A reference locus correction unit 104 has the same function as the scanning start position generator 122 shown in FIG. 6. Other units and elements in FIG. 11 are the same as those in FIG. 6.

Here, the table 102 stores the settling times calculated by the table updating unit 110. Then, the reference locus correction unit 104 updates the start position of scanning operation $S_n$ in accordance with the following equation (6) with reference to calculated settling times as in the third embodiment, and outputs an X coordinate reference input and a Y coordinate reference input to the X coordinate reference position generator 105 and the Y coordinate reference position generator 106, respectively. Note, the equation (6) is the same as the equation (5) except a point that the equation (6) does not have the safety factor σ.

$$S'_n = S_n - V_s \cdot (t_n - T_s) \qquad (6)$$

The updating of the settling times $t_n$ in the table 102 is performed in the following manner.

First, the settling judgment unit 107 checks whether or not both of a deviation of control variables in the X coordinate and a deviation of control variables in the Y coordinate are within a predetermined range for a predetermined period of time to perform settling judgment, and the judged result is transmitted to the settling time measurement unit 108. The settling time measurement unit 108 sets the timer 9 to 0 at the end of acceleration, and measures a period of time until the settling judgment unit 107 judges that the XY stage 119 is settled. The table updating unit 110 compares the settling time $t_n$ stored in the table 102 to a value $T_{en}$ obtained by adding an offset value $T_t$ to an average $T_{an}$ of the settling times $T_n$ which are measured by the settling time measurement unit 108 M times (M is a predetermined natural number) in the n-th scanning section (n=1~N, N is the total number of scanning sections). If $T_{en} > t_n$ or $T_{en} < t_n - T_r$ ($T_r$ is a predetermined threshold), then the table updating unit 108 updates the settling time $t_n$ stored in the table 102 by substituting it by $T_{en}$.

It should be noted that the reference locus correction unit 104, the X coordinate reference position generator 105, the Y coordinate reference position generator 106, the settling judgment unit 107, the settling time measurement unit 108, the timer 109, the table updating unit 110, the X axis controller 111, and the Y axis controller 112 are realized as algorithms executed by a CPU (not shown).

In the apparatus of the fourth embodiment, it is possible to shorten the period of time required for scanning the entire surface of a wafer, as in the third embodiment. In addition, when control characteristics of the XY stage 119 are changed which causes changes in actual settling times, a reference locus is corrected in accordance with the changes by updating the settling times $t_n$ stored in the table 102. Accordingly, it is possible to completely settle the XY stage 119 in each exposure section, thereby it is possible to prevent failure of exposure operation.

Fifth Embodiment

Figure 12:
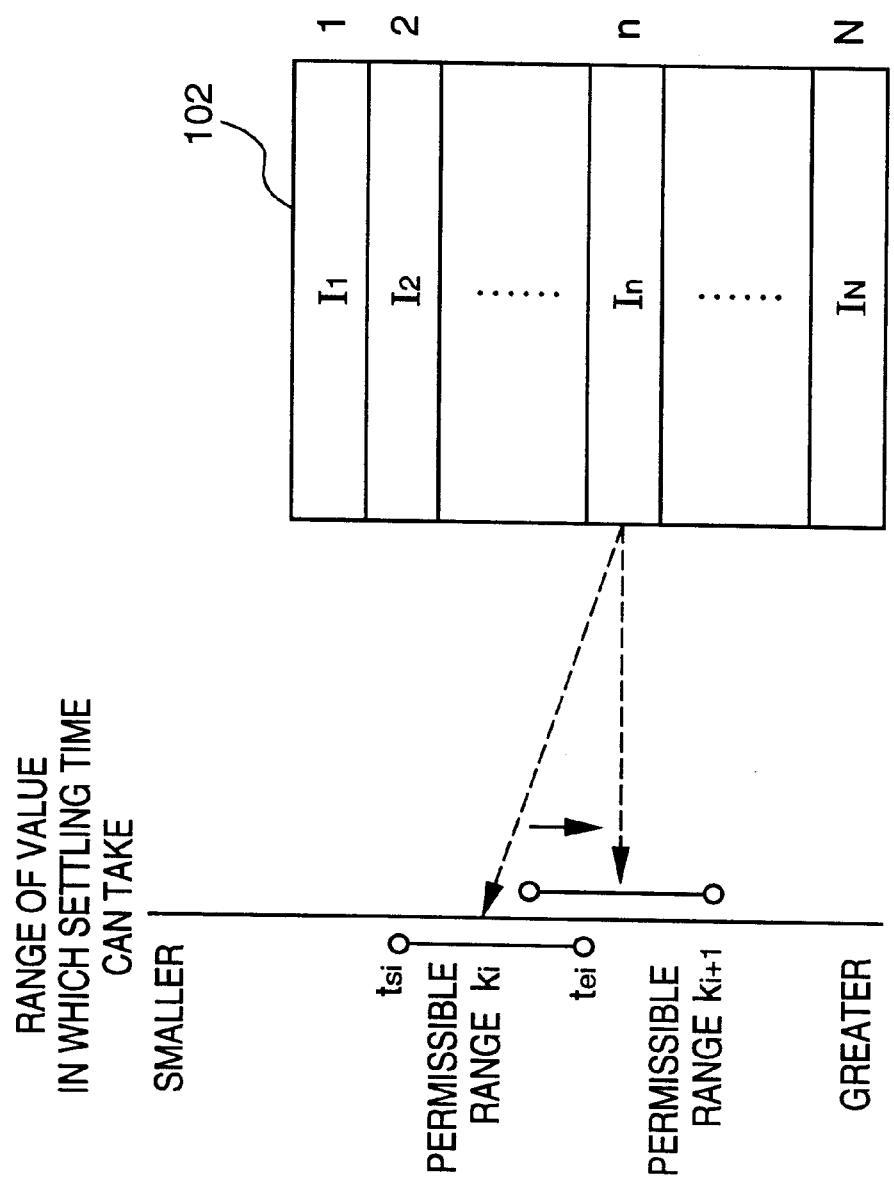
FIG. 12 is an explanatory view showing how an index is updated in a case where a sum is larger than the upper limit of a permissible range indicated by a current index.

In the fifth embodiment, the apparatus described in the fourth embodiment is changed as follows. The operation of an XY stage control apparatus in a scanning type exposure apparatus according to the fifth embodiment will be explained with reference to FIG. 12.

In the fifth embodiment, instead of storing settling times in the table 102, indexes $I_n$ (n=1~N, N is the total number of scanning sections) each of which designates a permissible range $K_i$ (i=1~L, L is the number of permissible ranges) are stored. Each permissible range $K_i$ determines a range ($t_{sn} < t_n < T_{en}$) of each settling time $t_n$. Further, each permissible range is set so that a part of the section overlaps the next permissible range.

The table updating unit 110 judges whether or not an actual settling time $T_n$ measured by the settling time measurement unit 108 belongs to a permissible range designated by an index $I_n$ which is currently referred to, and if not, the contents of the index $I_n$ are changed to other contents which indicate a permissible range where the actual settling time $T_n$ belongs.

More specifically, an offset value $T_t$ is added to the actual settling time $T_n$, and if the sum of $T_n + T_t$ is smaller than the lower limit tsi of the permissible range $K_i$ indicated by the index $I_n$ which is currently referred to, the content of the index In is changed so as to indicate a permissible range $K_{i-1}$ having a smaller lower limit than that of the permissible range $K_i$. If, however, the sum of $T_n + T_t$ is larger than the upper limit of the permissible range $K_i$, the index $I_n$ is changed so as to indicate a permissible range $K_{i+1}$ having a larger upper limit than that of the permissible range $K_i$ (refer to FIG. 12). Further, if the sum of $T_n + T_t$ is within the permissible range $K_i$ designated by the index $I_n$ which is currently referred to, the index $I_n$ is not changed.

The reference locus correction unit 104 uses a central value, for example, of a permissible range designated by the index $I_n$ as a settling time $T_n$ to update the start position of scanning operation $S_n$.

Note, the data which determines a permissible range may be stored in the memory 103, the reference locus correction unit 104, and so on, for example.

According to the fifth embodiment, it is possible to minimize an effect of measurement errors of settling times since a reference locus (start position of scanning operation) is not updated when a small variation in settling time occurs.

According to the present invention described in the third to fifth embodiments, a reference scanning locus generated on the basis of a predetermined settling time is corrected by using an actual settling time stored in the settling time table, it is possible to shorten the period of time required for scanning and to completely settle the XY stage in an exposure section by adding a simple algorithm without configuring a complicated controller.

Furthermore, in the aforesaid apparatuses, a settling time is measured whenever scanning operation is performed for the reference scanning locus generated on the basis of a predetermined settling time, and the difference between the predetermined settling time and the measured settling time is corrected by correcting the reference scanning locus. Accordingly, it is possible to respond to the change of control characteristics. Further, it is also possible to automatically control the reference scanning locus.

The present invention is not limited to the above embodiments and various changes and modifications can be made within the spirit and scope of the present invention. Therefore to appraise the public of the scope of the present invention, the following claims are made.

What is claimed is:

1. A scanning exposure apparatus which scans and exposes each of exposure areas on a plate through an original, said apparatus comprising:

driving means for synchronously moving the original and the plate;

exposure means for exposing the exposure area through the original after the original and the plate are accelerated to a scanning speed for performing a scanning exposure operation by said driving means and a settling time is passed so that a synchronous error between the original and the plate converges within a predetermined range;

a memory medium storing settling times each of which corresponds to a position of the associated exposure area and the scanning speed; and control means for determining a first start position at which the original starts accelerating and a second start position at which the plate starts accelerating, for each of the exposure areas, on a basis of the stored settling time corresponding to the position of the associated exposure area and the scanning speed by referring to said memory medium, and controlling said driving means based upon the first and second start positions for each of the exposure areas.

2. The scanning exposure apparatus according to claim 1, wherein each of the settling times stored in said memory medium has been determined in advance on a basis of an absolute value of the synchronous error between the original and the plate.

3. The scanning exposure apparatus according to claim 1, wherein each of the settling times stored in said memory medium has been determined in advance on a basis of an average and a standard deviation of the synchronous error between the original and the plate in a predetermined period of time.

4. The scanning exposure apparatus according to claim 3, wherein said exposure means is adapted to expose each of the exposure areas on the plate by a strip of light, and wherein the predetermined period of time is obtained by dividing a width of the strip of light by the scanning speed.

5. The scanning exposure apparatus according to claim 3, wherein said exposure means is adapted to expose each of the exposure areas on the plate by a strip of light, and wherein each of the settling times stored in said memory medium has been determined in advance on the basis of a multiplied result of the synchronous error between the original and the plate in a predetermined period of time and intensity of the strip of light.

6. The scanning exposure apparatus according to claim 3, wherein said exposure means is adapted to expose each of the exposure areas on the plate by a strip of light, and wherein each of the settling times stored in said memory medium has been determined in advance on a basis of the synchronous errors between the original and the plate in a predetermined period of time and a distribution of intensity of the strip of light.

7. A scanning exposure method of scanning and exposing exposure areas on a plate through an original while synchronously moving the original and the plate, said method comprising:

a referring step of referring to a memory medium storing settling times each of which is required for converging a synchronous error between the original and the plate within a predetermined range at a position of an associated exposure area and a scanning speed for performing a scanning exposure operation, and selecting one of the settling times for each of the exposure areas and the scanning speed;

a determining step of determining a first start position at which the original starts accelerating and a second start position at which the plate starts accelerating, for each of the exposure areas, on a basis of the selected settling time; and a control step of controlling the scanning exposure operation so that each of the exposure areas is exposed after the original and the plate are accelerated to the scanning speed and the selected settling time has passed.

8. The method according to claim 7, wherein each of the settling times stored in the memory medium has been determined in advance on a basis of an absolute value of the synchronous error between the original and the plate.

9. The method according to claim 7, wherein each of the settling times stored in the memory medium has been determined in advance on a basis of an average and a standard deviation of the synchronous error between the original and the plate in a predetermined time period.

10. The method according to claim 9, wherein each of the exposure areas on the plate is exposed by a strip of light, and wherein the predetermined period of time is obtained by dividing a width of the strip of light by the scanning speed.

11. The method according to claim 9, wherein each of the exposure areas on the plate is exposed by a strip of light, and wherein each of the settling times stored in said memory medium has been determined in advance on a basis of a multiplied result of the synchronous error between the original and the plate in a predetermined period of time and an intensity of the strip of light.

12. The method according to claim 9, wherein each of the exposure areas on the plate is exposed by a strip of light, and wherein each of the settling times stored in said memory medium has been determined in advance on a basis of the synchronous error between the original and the plate in a predetermined period of time and a distribution of intensity of the strip of light.

\* \* \* \* \*

UNITED STATES PATENT AND TRADEMARK OFFICE
CERTIFICATE OF CORRECTION

PATENT NO. : 5,936,710

DATED : August 10, 1999

INVENTOR(S): HIROSHI ITOH, ET AL.

Page 1 of 3

Figure 4A:
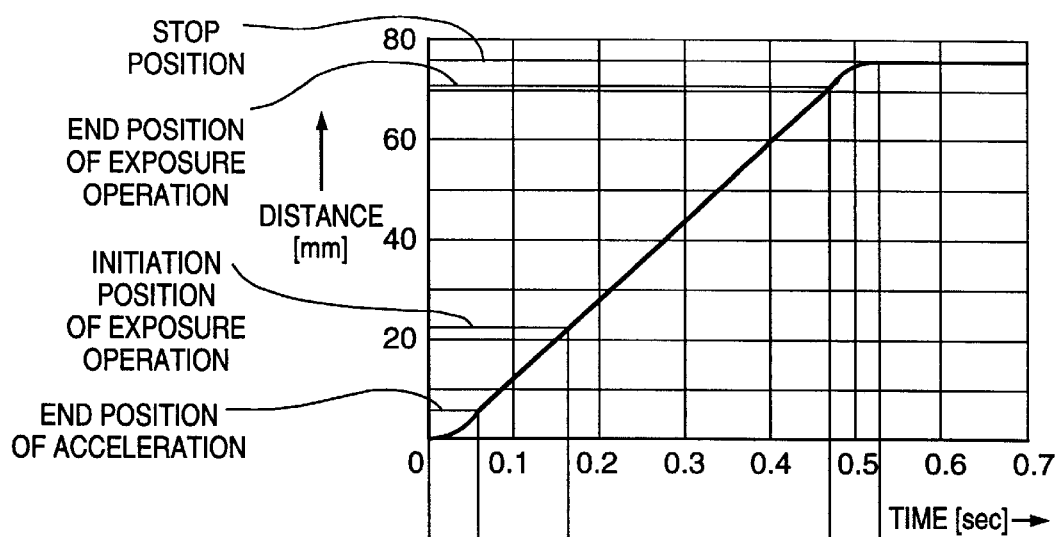
FIGS. 4A to 4C are graphs showing distance, speed and synchronous errors of wafer movement with respect to time.
Figure 4B:
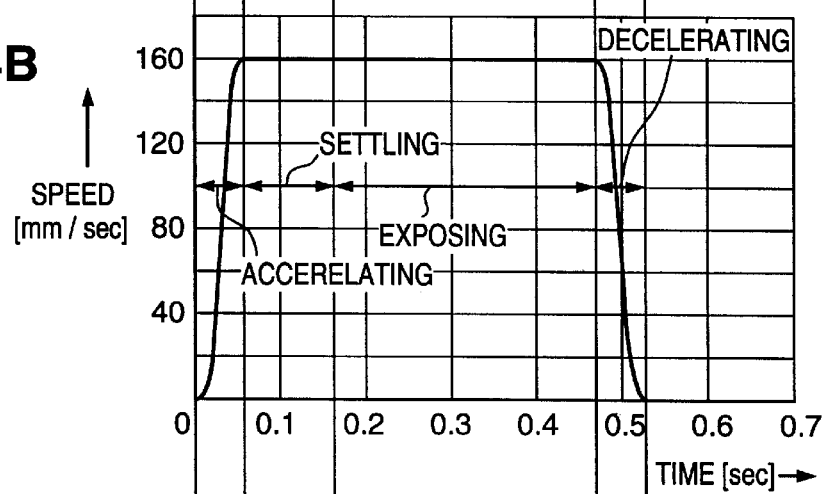
Figure 4C:
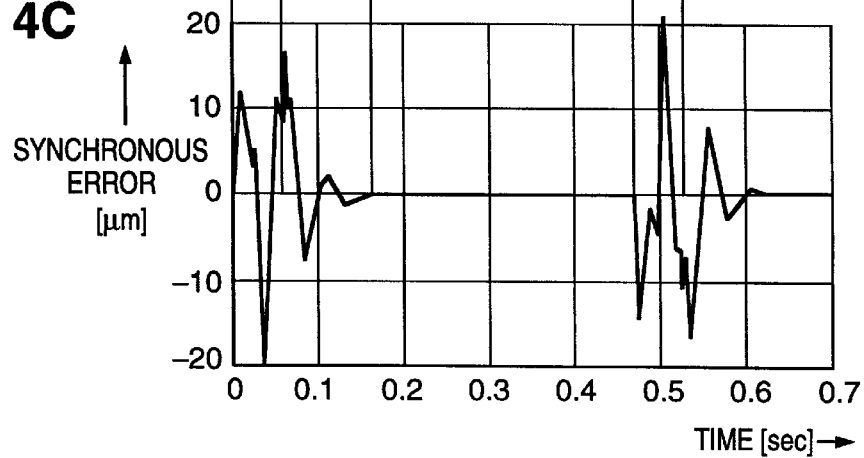

It is certified that error appears in the above-identified patent and that said Letters Patent is hereby corrected as shown below:

IN THE DRAWINGS:

Sheet 5, in FIGURE 4B, "ACCERELATING" should read --ACCELERATING--.

COLUMN 1,

Line 25, "a" should be deleted;
Line 39, "an other" should read --another--;
Line 57, "chip" should read --chips--;
Line 59, "and" should read --although--; and
Line 63, "will" should read --will be--.

COLUMN 2,

Line 28, "follow" should read --follows--; and
Line 64, "changes" should read --change--.

UNITED STATES PATENT AND TRADEMARK OFFICE
CERTIFICATE OF CORRECTION

PATENT NO. : 5,936,710

DATED : August 10, 1999

INVENTOR(S): HIROSHI ITOH, ET AL.

It is certified that error appears in the above-identified patent and that said Letters Patent is hereby corrected as shown below:

COLUMN 3,

Line 4, "In" should read --On the--.

COLUMN 8,

Line 8, "to as follow." should read --as follows.--.

COLUMN 9,

Line 17, "given" should read --assume--.

COLUMN 11,

Line 22, "(referred" should read --(referred to--;
Line 54, "had" should read --hand--; and
Line 59, "had" should read --hand--.

COLUMN 12,

Line 1, "lane" should read --plane--; and
Line 38, "smaller" should read --smaller than--.

UNITED STATES PATENT AND TRADEMARK OFFICE
CERTIFICATE OF CORRECTION

PATENT NO. : 5,936,710

DATED : August 10, 1999

INVENTOR(S): HIROSHI ITOH, ET AL.

It is certified that error appears in the above-identified patent and that said Letters Patent is hereby corrected as shown below:

<u>COLUMN 13</u>,

Line 5, "a point" should be deleted; and
Line 12, "of" should be deleted.

<u>COLUMN 14</u>,

Line 28, "it" should read --so that it--; and
Line 44, "appraise" should read --apprise--.

Signed and Sealed this

Thirtieth Day of May, 2000

Attest:

Q. TODD DICKINSON

*Attesting Officer*     *Director of Patents and Trademarks*